United States Patent
Kim et al.

(10) Patent No.: US 9,625,778 B2
(45) Date of Patent: Apr. 18, 2017

(54) LIQUID CRYSTAL DISPLAY

(71) Applicant: Samsung Display Co. Ltd., Yongin, Gyeonggi-Do (KR)

(72) Inventors: Hoon Kim, Ansan-si (KR); Su Jeong Kim, Seoul (KR); Hee Seop Kim, Hwaseong-si (KR); Ki Chul Shin, Seongnam-si (KR)

(73) Assignee: Samsung Display Co., Ltd. (KR)

( * ) Notice: Subject to any disclaimer, the term of this patent is extended or adjusted under 35 U.S.C. 154(b) by 88 days.

(21) Appl. No.: 14/663,199

(22) Filed: Mar. 19, 2015

(65) Prior Publication Data

US 2016/0161790 A1    Jun. 9, 2016

(30) Foreign Application Priority Data

Dec. 8, 2014    (KR) .................. 10-2014-0175210

(51) Int. Cl.
    *G02F 1/1362*      (2006.01)
    *G02F 1/1368*      (2006.01)
    (Continued)

(52) U.S. Cl.
CPC ........ *G02F 1/13624* (2013.01); *G02F 1/1368* (2013.01); *G02F 1/13306* (2013.01);
(Continued)

(58) Field of Classification Search
CPC ............... G09G 3/3648; G09G 3/3659; G09G 2300/0876; G09G 2300/0809; G09G 2300/0465; G09G 2300/0426; G09G 3/3233; G09G 3/36; G09G 3/2074; G02F 1/13624; G02F 1/136213; G02F 2001/134345
(Continued)

(56) References Cited

U.S. PATENT DOCUMENTS

2008/0284931 A1* 11/2008 Kimura ............... G02F 1/13624
                                                                                                       349/39
2009/0153759 A1* 6/2009 Um ....................... G09G 3/3651
                                                                                                       349/39
(Continued)

FOREIGN PATENT DOCUMENTS

KR    10-2006-0008538     1/2006
KR    10-2011-0117998     10/2011
(Continued)

*Primary Examiner* — Koosha Sharifi-Tafreshi
(74) *Attorney, Agent, or Firm* — Innovation Counsel LLP

(57) ABSTRACT

A liquid crystal display is provided. A liquid crystal display comprises a first transistor having a gate electrode connected to a scan line, one electrode connected to a data line, and the other electrode connected to a first liquid crystal capacitor, a second transistor having one electrode connected to the data line, and the other electrode connected to a second liquid crystal capacitor through a first node, a third transistor having one electrode connected to the data line, and the other electrode connected to a third liquid crystal capacitor through a second node, a first distribution transistor having one electrode connected to the first node, and the other electrode connected to a sustain line and a second distribution transistor having one electrode connected to the second node, and the other electrode connected to the sustain line.

20 Claims, 6 Drawing Sheets

(51) Int. Cl.
    *G02F 1/133*     (2006.01)
    *H01L 27/12*     (2006.01)
    *G09G 3/36*     (2006.01)

(52) U.S. Cl.
    CPC ..... *G02F 1/136286* (2013.01); *G09G 3/3659* (2013.01); *H01L 27/1222* (2013.01); *H01L 27/1225* (2013.01); *H01L 27/1251* (2013.01); *G09G 2300/0447* (2013.01)

(58) Field of Classification Search
    USPC ..... 345/87, 92, 90; 349/38, 42, 39, 144, 143
    See application file for complete search history.

(56) References Cited

U.S. PATENT DOCUMENTS

2013/0057818 A1*   3/2013   Cho .................. G02F 1/134363
                                                        349/141
2013/0135572 A1*   5/2013   Park ................... G02F 1/134336
                                                        349/143

FOREIGN PATENT DOCUMENTS

KR     10-2013-0033802     4/2013
KR     10-2014-0097905     8/2014

* cited by examiner

LIQUID CRYSTAL DISPLAY

CROSS-REFERENCE TO RELATED APPLICATION

This application claims priority to Korean Patent Application No. 10-2014-0175210 filed on Dec. 8, 2014 in the Korean Intellectual Property Office, and all the benefits accruing therefrom under 35 U.S.C. 119, the contents of which in its entirety are herein incorporated by reference.

BACKGROUND

1. Technical Field

The present inventive concept relates to a liquid crystal display.

2. Description of the Related Art

A liquid crystal display that is one of the most widely used flat panel display devices includes two substrates on which field generating electrodes such as a pixel electrode and a common electrode are formed and a liquid crystal layer between the two substrates. The liquid crystal display generates an electric field in the liquid crystal layer by applying a voltage to the field generating electrodes, thereby determining a direction of liquid crystal molecules of the liquid crystal layer and displaying an image by controlling polarization of incident light.

Among the liquid crystal displays, a vertically aligned mode liquid crystal display has been developed in which liquid crystal molecules are arranged such that a major axis of the liquid crystal molecules is perpendicular to a display panel in a state where an electric field is not applied.

The vertically aligned mode liquid crystal display has been developed in a variety of structures including a structure of dividing one pixel into two sub-pixels having different gray scales to ensure lateral visibility.

SUMMARY

The present inventive concept provides a three-division liquid crystal display having no reduction in aperture ratio without introducing a double electrode structure.

Embodiments of the present inventive concept provide at least the following effects.

It is possible to improve side visibility while minimizing a reduction in aperture ratio without introducing a double electrode structure.

It is possible to improve the flexibility of adjustment of a voltage ratio by adjusting the channel size of a distribution transistor, and thus, it may be advantageous to the optimization of the image quality.

The effects of the present inventive concept are not limited to the above-described effects and other effects which are not described herein will become apparent to those skilled in the art from the following description.

According to an aspect of the present inventive concept, a liquid crystal display comprising a first transistor having a gate electrode connected to a scan line, one electrode connected to a data line, and the other electrode connected to a first liquid crystal capacitor, a second transistor having a gate electrode connected to the scan line, one electrode connected to the data line, and the other electrode connected to a second liquid crystal capacitor through a first node, a third transistor having a gate electrode connected to the scan line, one electrode connected to the data line, and the other electrode connected to a third liquid crystal capacitor through a second node, a first distribution transistor having a gate electrode connected to the scan line, one electrode connected to the first node, and the other electrode connected to a sustain line and a second distribution transistor having a gate electrode connected to the scan line, one electrode connected to the second node, and the other electrode connected to the sustain line.

The first and second distribution transistors may have different channel sizes.

A ratio of a voltage applied to the second liquid crystal capacitor to a voltage applied to the first liquid crystal capacitor may be 0.60 to 0.70, and a ratio of a voltage applied to the third liquid crystal capacitor to a voltage applied to the first liquid crystal capacitor may be 0.76 to 0.82.

The amounts of charges charged in the first to third liquid crystal capacitors may be different from each other.

The amount of charges charged in the first liquid crystal capacitor may be greater than the amount of charges charged in the second liquid crystal capacitor, and the amount of charges charged in the second liquid crystal capacitor may be greater than the amount of charges charged in the third liquid crystal capacitor.

A sustain voltage provided from the sustain line and a data voltage may have different voltage levels.

In other aspect of the present inventive concept, a liquid crystal display comprising a data driver providing a data voltage to each of a plurality of data lines, a scan driver providing a scan signal to each of a plurality of scan lines and a display panel including pixels, each pixel having first to third sub-pixels which receive the data voltage in response to the scan signal, wherein the second sub-pixel includes a first distribution transistor having one electrode connected to a sustain line, and the third sub-pixel includes a second distribution transistor having one electrode connected to the sustain line, and wherein the first and second distribution transistors have different channel sizes.

The first sub-pixel may include a first transistor having a gate electrode connected to the scan line and one electrode connected to the data line, and a first liquid crystal capacitor connected to the other electrode of the first transistor, the second sub-pixel may further include a second transistor having a gate electrode connected to the scan line, one electrode connected to the data line, and the other electrode connected to the other electrode of the first distribution transistor through a first node, and a second liquid crystal capacitor connected to the first node, and the third sub-pixel further may include a third transistor having a gate electrode connected to the scan line, one electrode connected to the data line, and the other electrode connected to the other electrode of the second distribution transistor through a second node, and a third liquid crystal capacitor connected to the second node.

The first transistor outputs the data voltage in response to the scan signal, and the output data voltage may be applied to the first liquid crystal capacitor.

The second transistor may output the data voltage to the first node in response to the scan signal, and the first distribution transistor may output a sustain voltage provided from the sustain line to the first node in response to the scan signal.

The third transistor may output the data voltage to the second node in response to the scan signal, and the second distribution transistor may output a sustain voltage provided from the sustain line to the second node in response to the scan signal.

The amount of charges charged in the first liquid crystal capacitor may be greater than the amount of charges charged in the second liquid crystal capacitor, and the amount of charges charged in the second liquid crystal capacitor may be greater than the amount of charges charged in the third liquid crystal capacitor.

A ratio of a voltage applied to the second liquid crystal capacitor to a voltage applied to the first liquid crystal capacitor may be 0.65 to 0.70, and a ratio of a voltage applied to the third liquid crystal capacitor to a voltage applied to the first liquid crystal capacitor may be 0.76 to 0.82.

In other aspect of the present inventive concept, a liquid crystal display comprising a data driver providing a data voltage to each of a plurality of data lines, a scan driver providing a scan signal to each of a plurality of scan lines and a display panel including pixels, each pixel having first to third sub-pixels which receive the data voltage in response to the scan signal, wherein the second sub-pixel includes a first distribution transistor having one electrode connected to a first sustain line, and the third sub-pixel includes a second distribution transistor having one electrode connected to the second sustain line.

A first sustain voltage provided from the first sustain line and a second sustain voltage provided from the second sustain line may have different voltage levels.

The first sub-pixel may include a first transistor having a gate electrode connected to the scan line and one electrode connected to the data line, and a first liquid crystal capacitor connected to the other electrode of the first transistor, the second sub-pixel may further include a second transistor having a gate electrode connected to the scan line, one electrode connected to the data line, and the other electrode connected to the other electrode of the first distribution transistor through a first node, and a second liquid crystal capacitor connected to the first node, and the third sub-pixel further may include a third transistor having a gate electrode connected to the scan line, one electrode connected to the data line, and the other electrode connected to the other electrode of the second distribution transistor through a second node, and a third liquid crystal capacitor connected to the second node.

The first sub-pixel may output the data voltage through a switching operation of the first transistor, and the output data voltage may be applied to the first liquid crystal capacitor.

The second transistor may output the data voltage to the first node in response to the scan signal, and the first distribution transistor outputs a first sustain voltage provided from the first sustain line to the first node in response to the scan signal, and the third transistor may output the data voltage to the second node in response to the scan signal, and the second distribution transistor may output a second sustain voltage provided from the second sustain line to the second node in response to the scan signal.

The amount of charges charged in the first liquid crystal capacitor may be greater than the amount of charges charged in the second liquid crystal capacitor, and the amount of charges charged in the second liquid crystal capacitor may be greater than the amount of charges charged in the third liquid crystal capacitor.

A ratio of a voltage applied to the second liquid crystal capacitor to a voltage applied to the first liquid crystal capacitor may be 0.65 to 0.70, and wherein a ratio of a voltage applied to the third liquid crystal capacitor to a voltage applied to the first liquid crystal capacitor may be 0.76 to 0.82.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Figure 1:
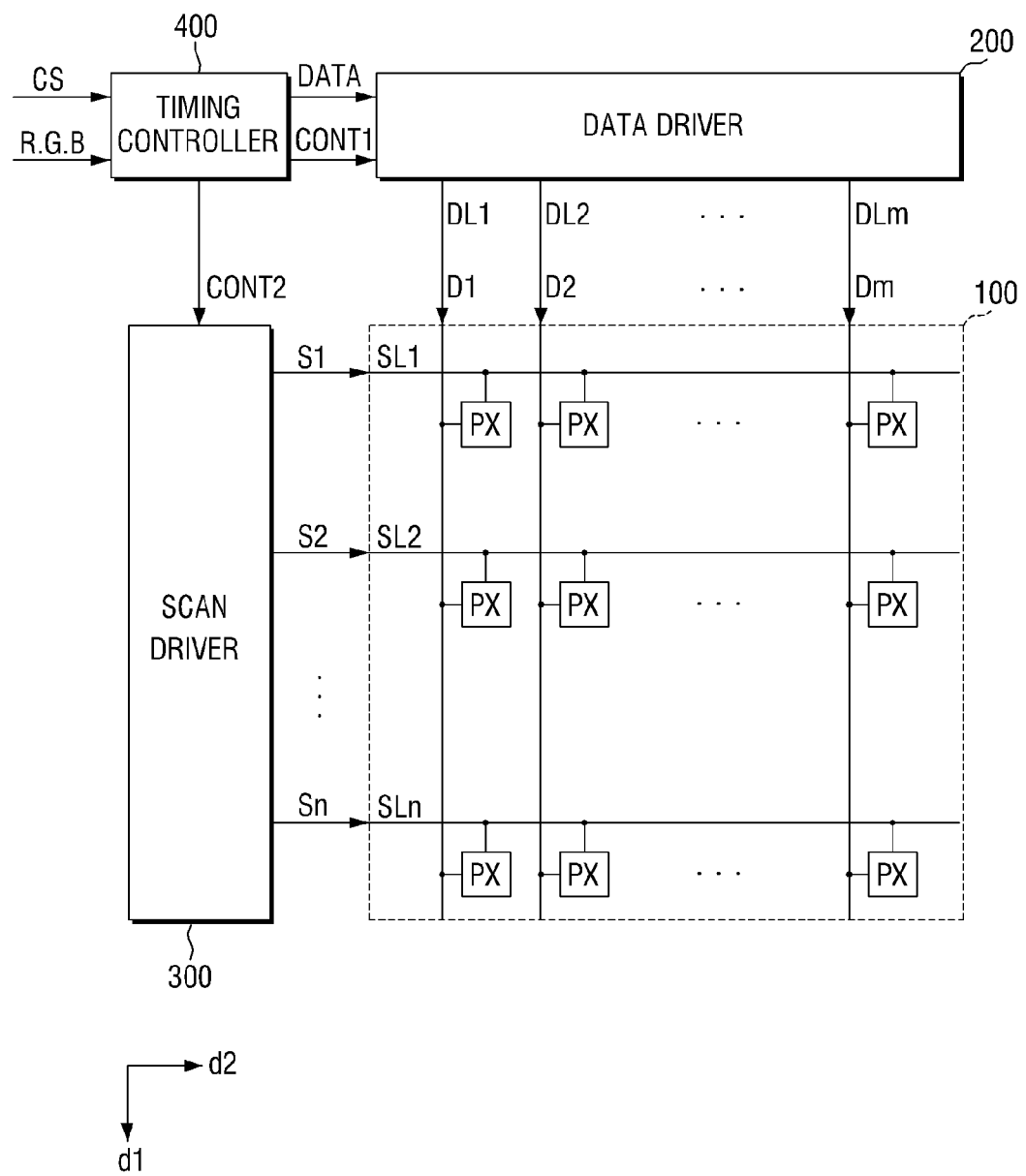
FIG. 1 is a block diagram showing a liquid crystal display according to an embodiment of the present inventive concept.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present between the element and the another element. In contrast, when an element is referred to as being "directly on", "directly connected to" or "directly coupled to" another element or layer, there are no intervening elements or layers present between the element and the another element. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, embodiments of the present inventive concept will be described with reference to the accompanying drawings.

FIG. 1 is a block diagram showing a liquid crystal display according to an embodiment of the present inventive concept.

Referring to FIG. 1, a liquid crystal display according to an embodiment of the present inventive concept may include a display panel 100, a data driver 200, a scan driver 300, a timing controller 400 and a voltage generator (not shown).

The display panel 100 may be a panel displaying an image. The display panel 100 may include a lower display panel 10 (see FIG. 4), an upper display panel 30 (see FIG. 4) facing the lower display panel 10, and a liquid crystal layer 20 disposed between the lower display panel 10 (see FIG. 4) and the upper display panel 30 (see FIG. 4). That is, the display panel 100 may be a liquid crystal panel. The display panel 100 may include a plurality of scan lines SL1 to SLn, and a plurality of data lines DL1 to DLm intersecting the plurality of scan lines SL1 to SLn. Further, the display panel 100 may include a plurality of pixels PXs, each being connected to one of the plurality of scan lines SL1 to SLn and one of the plurality of data lines DL1 to DLm. The plurality of scan lines SL1 to SLn, the plurality of data lines DL1 to DLm and the plurality of pixels PXs may be formed on the lower display panel 10 (see FIG. 4) of the display panel 100, and the respective lines may be arranged to be isolated from each other. The plurality of pixels PXs may be arranged in the form of a matrix. The plurality of data lines DL1 to DLm may extend in a first direction d1, and the plurality of scan lines SL1 to SLn may extend in a second direction d2 intersecting the first direction d1. Referring to FIG. 1, the first direction d1 may be a column direction, and the second direction d2 may be a row direction. Each of the pixels PXs may be connected to one of the plurality of scan lines SL1 to SLn and one of the plurality of data lines DL1 to DLm. Each of the pixels PX may receive a data voltage from a connected data line of the plurality of data lines DL1 to DLm in response to a scan signal provided from a connected scan line of the plurality of scan lines SL1 to SLn. Further, the respective pixels PXs may include a plurality of lines (hereinafter, "sustain voltage lines") transmitting a voltage (hereinafter, referred to as "sustain voltage" in this embodiment) commonly applied to the plurality of pixels PXs. Each of the pixels PXs may receive the sustain voltage applied from the sustain voltage lines.

The data driver 200 may include a shift register, a latch, a digital-to-analog converter (DAC), and the like. The data driver 200 may receive a first control signal CONT1 and image data DATA from the timing controller 400. The data driver 200 may select a reference voltage corresponding to the first control signal CONT1, and may convert the image data DATA of a digital waveform which is inputted according to the selected reference voltage into a plurality of data voltages D1 to Dm. The data driver 200 may provide the generated data voltages D1 to Dm to the display panel 100.

The scan driver 300 may receive a second control signal CONT2 from the timing controller 400. The scan driver 300 may provide a plurality of scan signals S1 to Sn to the display panel 100 in response to the second control signal CONT2.

The timing controller 400 may receive image signals R, G and B and their control signal CS inputted from the outside. The control signal CS may include a vertical synchronization signal Vsync, a horizontal synchronization signal Hsync, a main clock signal MCLK, a data enable signal DE, and the like. The timing controller 400 may generate the image data DATA, the first control signal CONT1, and the second control signal CONT2 after processing the signals provided from the outside to meet the operating conditions of the display panel 100. The first control signal CONT1 may include a horizontal synchronization start signal STH instructing the input start of the image data DATA, a load signal TP controlling the application of a data voltage to the data lines DL1 to DLm and the like. The second control signal CONT2 may include a scanning start signal STV instructing the output start of the scan signals S1 to Sn, a gate clock signal CPV controlling the output timing of a scan-on pulse, and the like.

A power supply unit (not shown) may supply operating power of the liquid crystal display according to the present inventive concept, and provide a common voltage Vcom to the display panel 100.

The display panel 100 may include a common line (not shown). The common line may be a line for supplying the common voltage Vcom provided from the power supply unit to a common electrode of the display panel 100. The common line may be arranged to extend along one direction on one side of the display panel 100. The common line may be formed on the lower display panel 10 (see FIG. 4) or the upper display panel 30 (see FIG. 4), and may be insulated from the scan lines SL1 to SLn. The common electrode may be formed integrally on the lower display panel 10 (see FIG. 4) or the upper display panel 30 (see FIG. 4), and the common voltage Vcom may be provided through the common line. An electric field may be formed in the liquid crystal layer 20 (see FIG. 4) according to a level difference between the common voltage Vcom and the data voltage provided to the pixels PXs. That is, the common voltage Vcom may provide a reference potential to the liquid crystal layer 20 (see FIG. 4).

Figure 2:
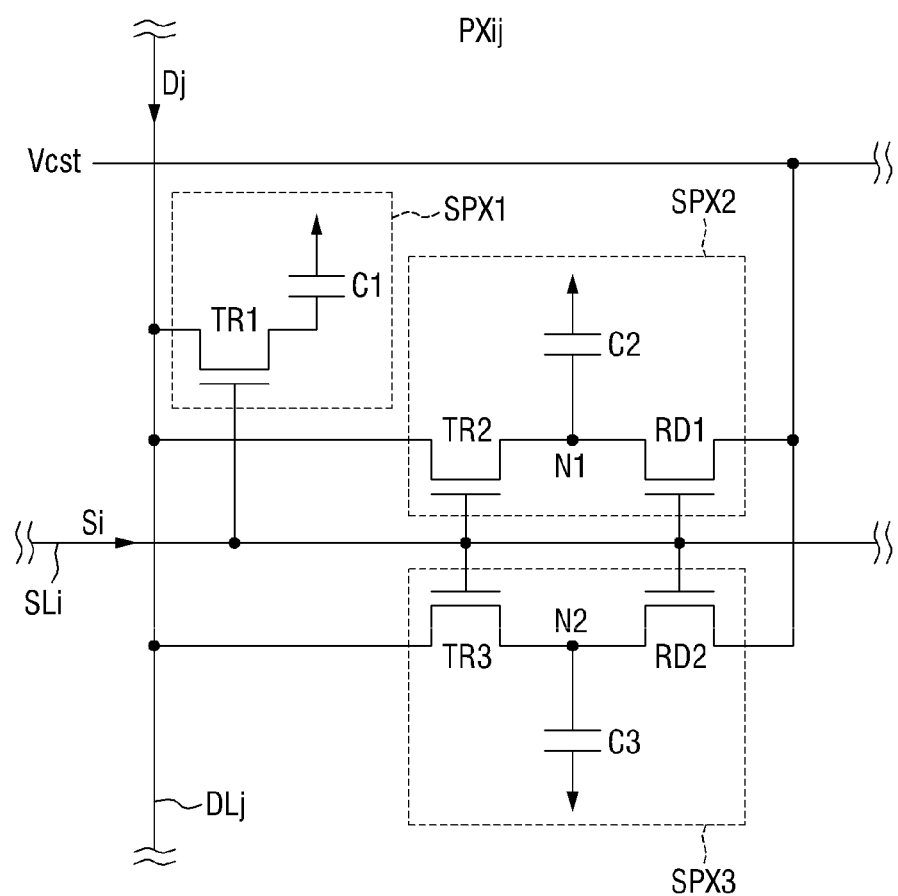
FIG. 2 is an equivalent circuit diagram showing a pixel according to the embodiment of the present inventive concept.

FIG. 2 is an equivalent circuit diagram of the pixel PX according to the embodiment of the present inventive concept. In this case, the pixel PX shown in FIG. 2 is an exemplary circuit diagram showing a pixel PXij connected to the i-th scan line SLi and the j-th data line DLj. Further, the i-th scan line SLi and the j-th data line DLj shown in FIG. 2 may represent one of the scan lines SL1 to SLn and one of the data lines DL1 to DLm included in the liquid crystal display according to the embodiment of the present inventive concept.

Referring to FIG. 2, the pixel PXij may include first to third sub-pixels SPX1, SPX2 and SPX3.

The first sub-pixel SPX1 may include a first transistor TR1 and a first liquid crystal capacitor C1. The first transistor TR1 may have a gate electrode connected to the i-th scan line SLi, one electrode connected to the j-th data line DLj, and the other electrode connected to the first liquid crystal capacitor C1. The first transistor TR1 may be turned on in response to the i-th scan signal Si provided from the i-th scan line SLi. In this case, the j-th data voltage Dj provided from the j-th data line DLj may be provided to the first liquid crystal capacitor C1. The first liquid crystal capacitor C1 may include a first pixel electrode receiving the data voltage from the first transistor TR1 and a common electrode facing the first pixel electrode.

The second sub-pixel SPX2 may include a second transistor TR2, a first distribution transistor RD1, and a second liquid crystal capacitor C2. The second transistor TR2 may have a gate electrode connected to the i-th scan line SLi, one electrode connected to the j-th data line DLj, and the other electrode connected to the second liquid crystal capacitor C2 through a first node N1. The second transistor TR2 may be turned on in response to the i-th scan signal Si provided from the i-th scan line SLi. In this case, the j-th data voltage Dj provided from the j-th data line DLj may be provided to the second liquid crystal capacitor C2. The first distribution transistor RD1 may have a gate electrode connected to the i-th scan line SLi, one electrode connected to the first node N1 and the other electrode connected to a sustain line Vcst. The first distribution transistor RD1 may be turned on in response to the i-th scan signal Si provided from the i-th scan line SLi. In this case, the sustain voltage provided from the sustain line Vcst may be provided to the first node N1. The second liquid crystal capacitor C2 may include a second pixel electrode receiving a signal from each of the second transistor TR2 and the first distribution transistor RD1 and a common electrode facing the second pixel electrode. In this case, the j-th data voltage Dj provided from the second transistor TR2 may be divided according to the switching operation of the first distribution transistor RD1. More specifically, the second liquid crystal capacitor C2 may be charged with a voltage obtained by the voltage division according to the voltage difference between the j-th data voltage Dj and the sustain voltage provided from the sustain line Vcst and the resistance value of the first distribution transistor RD1.

The third sub-pixel SPX3 may include a third transistor TR3, a second distribution transistor RD2, and a third liquid crystal capacitor C3. The third transistor TR3 may have a gate electrode connected to the i-th scan line SLi, one electrode connected to the j-th data line DLj, and the other electrode connected to the third liquid crystal capacitor C3 through a second node N2. The third transistor TR3 may be turned on in response to the i-th scan signal Si provided from the i-th scan line SLi. In this case, the j-th data voltage Dj provided from the j-th data line DLj may be provided to the third liquid crystal capacitor C3. The second distribution transistor RD2 may have a gate electrode connected to the i-th scan line SLi, one electrode connected to the second node N2 and the other electrode connected to the sustain line Vcst. The second distribution transistor RD2 may be turned on in response to the i-th scan signal Si provided from the i-th scan line SLi. In this case, the sustain voltage provided from the sustain line Vcst may be provided to the second node N2. The third liquid crystal capacitor C3 may include a third pixel electrode receiving a signal from each of the third transistor TR3 and the second distribution transistor RD2 and a common electrode facing the third pixel electrode. In this case, the j-th data voltage Dj provided from the third transistor TR3 may be divided according to the switching operation of the second distribution transistor RD2. The third liquid crystal capacitor C3 may be charged with a voltage obtained by the voltage division according to the voltage difference between the j-th data voltage Dj and the sustain voltage provided from the sustain line Vcst and the resistance value of the second distribution transistor RD2.

The first and second distribution transistors RD1 and RD2 may have different channel sizes. The channel size may indicate the width W of an aspect ratio W/L that is a ratio of the width W to the length L of a channel region of each transistor. In one embodiment, the channel size of the first distribution transistor RD1 may be greater than the channel size of the second distribution transistor RD2. Accordingly, the amount of charges charged in the second liquid crystal capacitor C2 may be relatively greater than the amount of charges charged in the third liquid crystal capacitor C3. This will be described later. The first to third transistors TR1 to TR3 and the first and second distribution transistors RD1 and RD2 may be p-type transistors in one embodiment. Further, the sustain voltage provided from the sustain line Vcst may have a voltage level different from the voltage level of the j-th data voltage Dj. For example, the sustain voltage may have a voltage level lower than the voltage level of the j-th data voltage Dj. The first to third transistors TR1 to TR3 and the first and second distribution transistors RD1 and RD2 may be turned on by receiving the i-th scan signal Si having a low level in a turn-on period (gate-on period) of one frame period. If the liquid crystal display according to the present inventive concept is driven at 60 Hz, the period corresponding to one frame may be 1/60 seconds. The above-described turn-on period of one frame period may be relatively shorter than a turn-off period in which the i-th scan signal Si having a high level is applied.

Hereinafter, the operation of the pixel PX having the equivalent circuit shown in FIG. 2 will be described with reference to FIGS. 1 and 2.

During one frame period, the scan lines SL1 to SLn may be sequentially provided with the scan signals S1 to Sn from the scan driver 300. That is, each of the scan lines SL1 to SLn may receive a scan signal having a low level only for a predetermined period of the frame period. Referring to FIG. 2, the pixel PXij may receive the scan signal Si having a low level through the i-th scan line SLi during a predetermined period of one frame period. Accordingly, all of the first to third transistors TR1 to TR3 and the first and second distribution transistors RD1 and RD2 may be turned on. The first liquid crystal capacitor C1 may be charged with the j-th data voltage Dj through the first transistor TR1. The second liquid crystal capacitor C2 may be charged with a voltage obtained by dividing the j-th data voltage Dj provided through the second transistor TR2 by the first distribution transistor RD1. That is, the second liquid crystal capacitor C2 may be charged with a voltage obtained by the voltage division according to the voltage difference between the j-th data voltage Dj and the sustain voltage provided from the sustain line Vcst and the resistance value of the first distribution transistor RD1. The third liquid crystal capacitor C3 may be charged with a voltage obtained by dividing the j-th data voltage Dj provided through the third transistor TR3 by the second distribution transistor RD2. That is, the third liquid crystal capacitor C3 may be charged with a voltage obtained by the voltage division according to the voltage difference between the j-th data voltage Dj and the sustain voltage provided from the sustain line Vcst and the resistance value of the second distribution transistor RD2. Accordingly, the amount of charges charged in each of the second and third liquid crystal capacitors C2 and C3 may be different from the amount of charges charged in the first liquid crystal capacitor C1. Further, since the first and second distribution transistors RD1 and RD2 are configured in different channel sizes, the amount of charges charged in the second liquid crystal capacitor C2 may be different from the amount of charges charged in the third liquid crystal capacitor C3 because the first and second distribution transistors RD1 and RD2 have different resistance values.

Consequently, the amounts of charges charged in the first to third liquid crystal capacitors C1 to C3 may be different from each other. In one embodiment, since the j-th data voltage Dj is divided by the first distribution transistor RD1 (or the second distribution transistor RD2) and provided to the second liquid crystal capacitor C2 (or the third liquid crystal capacitor C3), the amount of charges charged in the first liquid crystal capacitor C1 may be greater than the amount of charges charged in each of the second and third liquid crystal capacitors C2 and C3. Further, since the channel size of the first distribution transistor RD1 is greater than the channel size of the second distribution transistor RD2, the amount of charges charged in the second liquid crystal capacitor C2 may be greater than the amount of charges charged in the third liquid crystal capacitor C3. Specifically, a ratio of the voltage applied to the second liquid crystal capacitor C2 to the voltage applied to the first liquid crystal capacitor C1 may be 0.65 to 0.70, more particularly, 0.65. Further, a ratio of the voltage applied to the third liquid crystal capacitor C3 to the voltage applied to the first liquid crystal capacitor C1 may be 0.76 to 0.82, more particularly, 0.82. Accordingly, in the first to third sub-pixels SPX1, SPX2 and SPX3, since the amounts of charges charged in the first to third liquid crystal capacitors C1 to C3 are different from each other, the arrangement of liquid crystal molecules may be different from each other. That is, the amount of light passing through the first sub-pixel SPX1, the second sub-pixel SPX2 and the third sub-pixel SPX3 may be different, thus gray levels of the first sub-pixel SPX1, the second sub-pixel SPX2 and the third subpixel SPX3 may be different. Eventually, the side visibility of the image provided through the pixel PXij may be improved.

Figure 3:
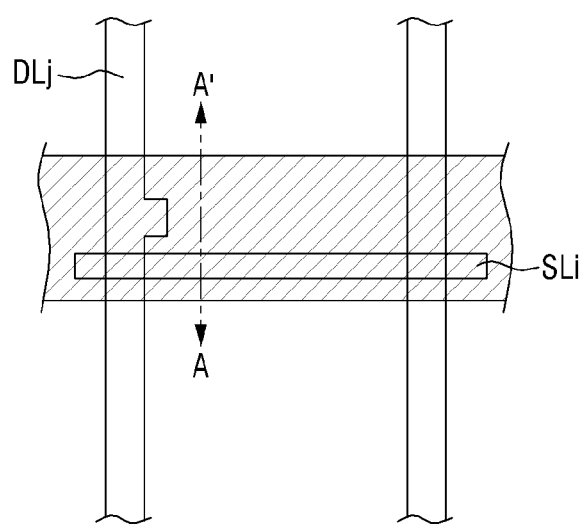
FIG. 3 is a plan view showing the liquid crystal display according to the embodiment of the present inventive concept.
Figure 4:
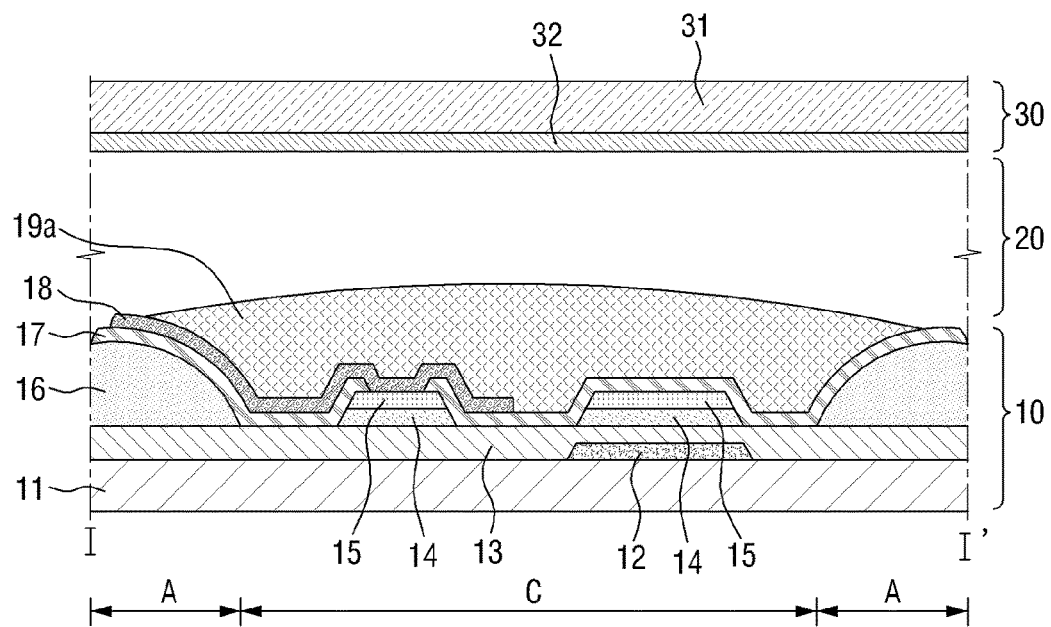
FIG. 4 is a cross-sectional view of one embodiment taken along line A-A' of FIG. 3.

FIG. 3 is a plan view showing a liquid crystal display according to an embodiment of the present inventive concept. FIG. 4 is a cross-sectional view of one embodiment taken along line A-A' of FIG. 3.

Referring to FIGS. 2, 3 and 4, the liquid crystal display according to the embodiment of the present inventive concept may include the lower display panel 10 and the upper display panel 30 facing each other and the liquid crystal layer 20 disposed between two display panels.

In the lower display panel 10, a plurality of scan lines including an i-th scan line 12 and the sustain line Vcst may be formed on a first substrate 11 including a pixel region. The first substrate 11 may be an insulating substrate formed of transparent glass or plastic. The plurality of scan lines may extend mainly in a horizontal direction to provide scan signals. The sustain line Vcst may extend in the horizontal direction to provide a sustain voltage. A gate insulating film 13 may be formed on the plurality of scan lines and the sustain line Vcst. On the gate insulating film 13, a plurality of linear semiconductors 14 formed of amorphous silicon, poly crystalline silicon, oxide semiconductor or the like may be arranged. The linear semiconductors 14 may extend mainly in a vertical direction. Although a plurality of ohmic contacts (not shown) may be formed on the linear semiconductors 14, the ohmic contacts may be omitted if the linear semiconductors 14 are oxide semiconductors. Data lines 15 including source electrodes and data conductors having drain electrodes may be arranged on the ohmic contacts and the gate insulating film 13. The gate electrode connected to the i-th scan line 12, the source electrode connected to the data line 15, the drain electrode spaced apart a predetermined distance from the source electrode, and the linear semiconductor 14 may constitute a thin film transistor. A contact between the thin film transistor and a pixel electrode may be formed in a transistor region C. A plurality of color filters 16 may not be disposed on a transistor region where the first to third transistors TR1 to TR3, and the first and second distribution transistors RD1 and RD2 are formed. That is, the plurality of color filters 16 may be located in an active region A that is a portion other than the transistor region C. The plurality of color filters 16 may include red color filters, green color filters and blue color filters which are spaced apart from each other. The plurality of color filters 16 may be arranged in the horizontal direction, but the present inventive concept is not limited thereto, and may be formed in a stripe shape along the vertical direction. Then, a SiNx protective film 17 may be formed on the color filters 16 and the transistor region C. A pixel electrode 18 may be formed on the SiNx protective film 17. The pixel electrode 18 may be formed of a transparent conductive material such as ITO or IZO, or reflective metal such as aluminum, silver, chromium or an alloy thereof. As shown in FIG. 4, a step may be generated because the color filters 16 in the transistor region C are removed. In this case, the liquid crystal display according to the present inventive concept may further comprise a black column spacer (BCS) 19a disposed between the plurality of color filters 16 arranged to be spaced apart from each other. The black column spacer 19a may partially overlap with the plurality of color filters 16, and may be arranged to cover the transistor region C where the thin film transistor is located. The black column spacer 19a may serve as a light blocking member to prevent light leakage, and it is possible to planarize the step between the plurality of color filters 16. Further, the black column spacer 19a may serve as a spacing member to support a gap between the upper display panel 30 and the lower display panel 10.

The upper display panel 30 may include a second substrate 31 and a common electrode 32 disposed on the second substrate 31. The second substrate 31 may be an insulating substrate formed of transparent glass or plastic. The common electrode 32 may be formed of a transparent conductive material to provide a common voltage. Meanwhile, an upper alignment layer (not shown) may be located on the common electrode 32.

A polarizer (not shown) may be formed on the outer surfaces of the lower and upper display panels 10 and 30, and the transmission axes of two polarizers may be orthogonal. Further, the polarizer may be disposed on one of the outer surface of the two display panels 10 and 30.

The liquid crystal layer 20 may have negative dielectric anisotropy. The liquid crystal molecules of the liquid crystal layer 20 may be oriented such that their major axis is perpendicular to the surfaces of the lower and upper display panels 10 and 30 in the absence of the electric field. Therefore, in the absence of the electric field, incident light may be blocked while failing to pass through the crossed rectilinear polarizers. Meanwhile, at least one of the liquid crystal layer 20 and the alignment film (not shown) may include a photo reactive material, more particularly, reactive mesogen. Accordingly, the liquid crystal molecules may have linear inclination such that their major axis is substantially parallel to the longitudinal direction of branch parts (not shown) of the pixel electrode 18.

Figure 5:
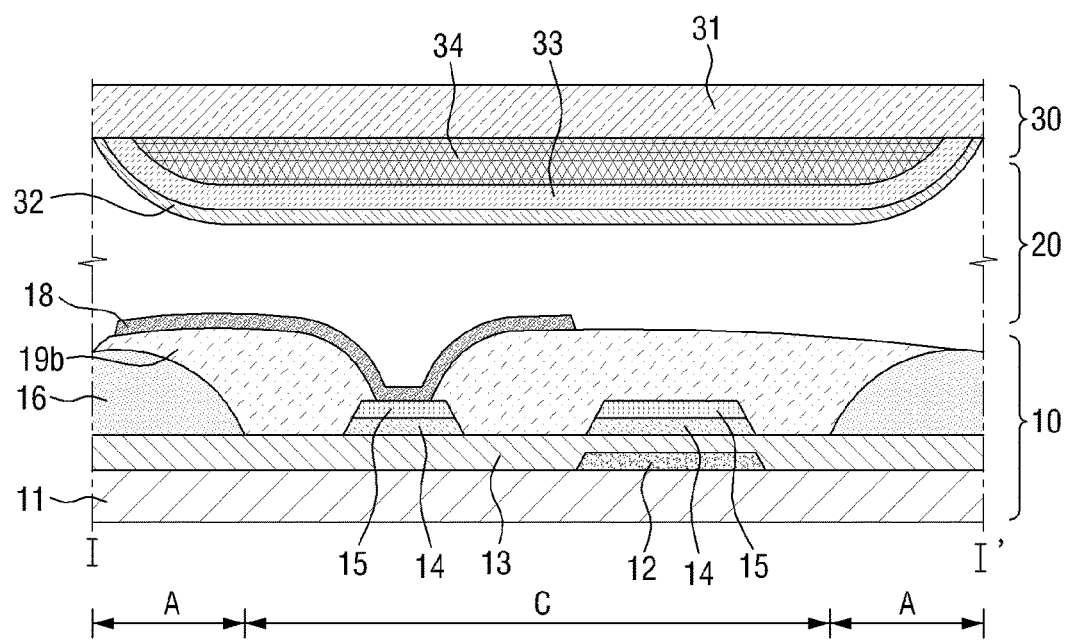
FIG. 5 is a cross-sectional view of another embodiment taken along line A-A' of FIG. 3.

FIG. 5 is a cross-sectional view of another embodiment taken along line A-A' of FIG. 3. However, a description of the same configuration as the configuration described with reference to FIG. 4 will be omitted to avoid redundancy.

Referring to FIG. 5, an liquid crystal display according to an embodiment of the present inventive concept may be configured such that a protective film 19b may be formed using an organic film on the plurality of color filters 16 and the transistor region C of the thin film transistor. That is, a contact with the transistor region C can be achieved through the protective film 19b formed using an organic film. Thus, the substrate may be planarized, and it is possible to minimize a step between the plurality of color filters 16. Therefore, unlike the case of FIG. 4, it may not include the black column spacer 19a in the transistor region C. Accordingly, in the case of FIG. 5, the upper display panel 30 may further include a light blocking member 34. More specifically, a light blocking member 34 may be formed on the second substrate 31, and the light blocking member 34 may serve as a black matrix (BM) preventing light leakage. The light blocking member 34 may cover the transistor region C. A region (active region A) which is not covered with the light blocking member 34 may be a display region for displaying an image by emitting light to the viewer. A planarization layer 33 having a planarized surface may be formed on the light blocking member 34. The planarization layer 33 may be formed of an organic material. The common electrode 32 formed of a transparent conductive material may be disposed on the planarization layer 33. The common electrode 32 may provide a common voltage.

On the other hand, the thin film transistor structure described with reference to FIGS. 4 and 5 is merely one embodiment, and a film structure including a thin film transistor structure may be modified in various ways.

Figure 6:
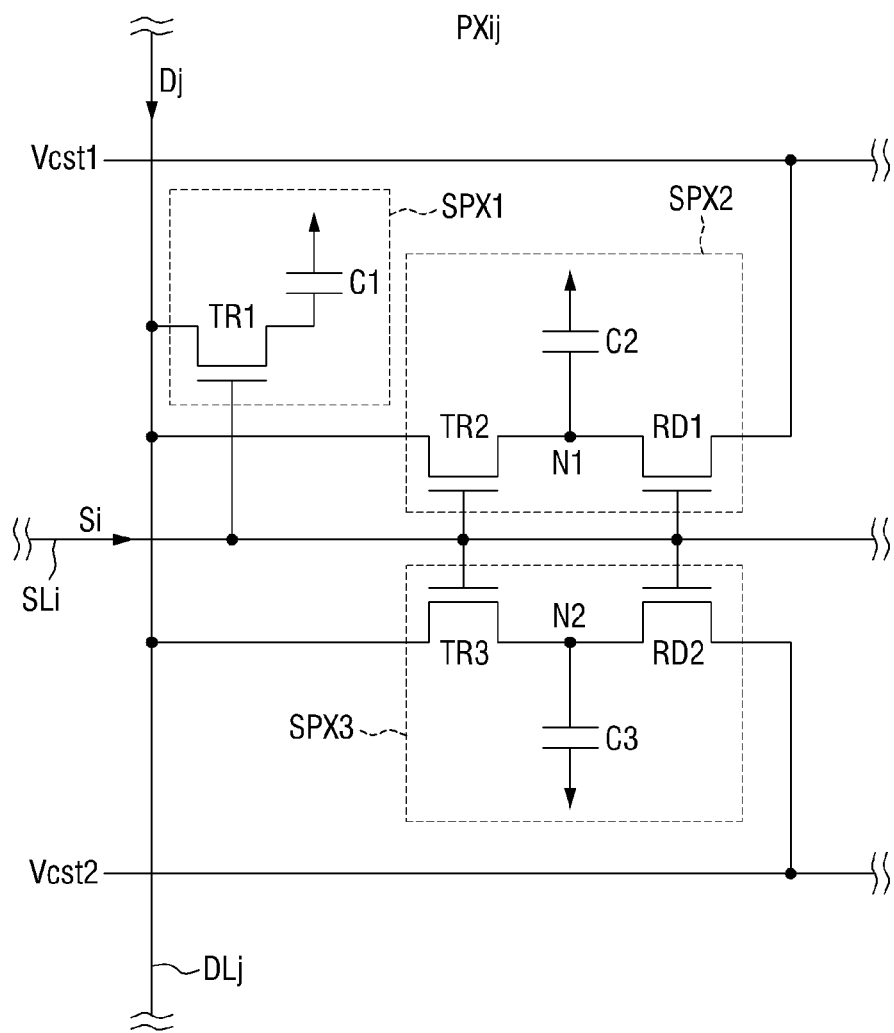
FIG. 6 is an equivalent circuit diagram showing a pixel according to another embodiment of the present inventive concept.

FIG. 6 is an equivalent circuit diagram showing a pixel according to another embodiment of the present inventive concept. In this case, FIG. 6 is an exemplary circuit diagram showing a pixel PXij connected to the i-th scan line SLi and the j-th data line DLj. Further, the i-th scan line SLi and the j-th data line DLj shown in FIG. 6 may represent one of the scan lines SL1 to SLn and one of the data lines DL1 to DLm included in the liquid crystal display according to the embodiment of the present inventive concept. Further, a repeated description of the same configuration of the pixel PXij according to the above-described embodiment of the present inventive concept in the case of FIG. 2 will be omitted.

Referring to FIG. 6, the pixel PXij according to another embodiment of the present inventive concept may include first to third sub-pixels SPX1, SPX2 and SPX3.

In the configuration of the second sub-pixel SPX2, a first distribution transistor RD1 may have a gate electrode connected to the i-th scan line SLi, one electrode connected to the first node N1 and the other electrode connected to a first sustain line Vcst1. The first distribution transistor RD1 may be turned on in response to the i-th scan signal Si provided from the i-th scan line SLi. In this case, the first sustain voltage provided from the first sustain line Vcst1 may be provided to the first node N1. The second liquid crystal capacitor C2 may include a second pixel electrode receiving a voltage from each of the second transistor TR2 and the first distribution transistor RD1 and a common electrode (not shown) facing the second pixel electrode. In this case, the j-th data voltage Dj provided from the second transistor TR2 may be divided according to the switching operation of the first distribution transistor RD1. More specifically, the second liquid crystal capacitor C2 may be charged with a voltage obtained by the voltage division according to the voltage difference between the j-th data voltage Dj and the first sustain voltage provided from the first sustain line Vcst1 and the resistance value of the first distribution transistor RD1. In the configuration of the third sub-pixel SPX3, a second distribution transistor RD2 may have a gate electrode connected to the i-th scan line SLi, one electrode connected to the second node N2 and the other electrode connected to a second sustain line Vcst2. The second distribution transistor RD2 may be turned on in response to the i-th scan signal Si provided from the i-th scan line SLi. In this case, a second sustain voltage provided from the second sustain line Vcst2 may be provided to the second node N2. The third liquid crystal capacitor C3 may include a third pixel electrode receiving a voltage from each of the third transistor TR3 and the second distribution transistor RD2 and a common electrode facing the third pixel electrode. In this case, the j-th data voltage Dj provided from the third transistor TR3 may be divided according to the switching operation of the second distribution transistor RD2. More specifically, the third liquid crystal capacitor C3 may be charged with a voltage obtained by the voltage division according to the voltage difference between the j-th data voltage Dj and the second sustain voltage provided from the second sustain line Vcst2 and the resistance value of the second distribution transistor RD2.

In this case, the first sustain voltage and the second sustain voltage may have different voltage levels. In one embodiment, the first sustain voltage may be the sum of the first voltage and the common voltage provided to the lower display panel 10 (see FIG. 4). Further, in one embodiment, the second sustain voltage may be the sum of the second voltage and the common voltage provided to the lower display panel 10 (see FIG. 4). In this case, the first voltage may have a voltage level of 5V, and the second voltage may have a voltage level of 1.5V. That is, the voltage level of the first voltage may be higher than the voltage level of the second voltage. Accordingly, in the pixel PXij according to another embodiment of the present inventive concept, even if the first and second distribution transistors RD1 and RD2 have the same channel size, since the first and second sustain voltages have different levels, the amounts of charges charged in the first to third liquid crystal capacitors C1 to C3 may be different from each other. In one embodiment, since the j-th data voltage Dj is divided by the first distribution transistor RD1 (or the second distribution transistor RD2) and provided to the second liquid crystal capacitor C2 (or the third liquid crystal capacitor C3), the amount of charges charged in the first liquid crystal capacitor C1 may be greater than the amount of charges charged in each of the second and third liquid crystal capacitors C2 and C3. Further, since the level of the first voltage is greater than the level of the second voltage, the amount of charges charged in the second liquid crystal capacitor C2 may be greater than the amount of charges charged in the third liquid crystal capacitor C3. Since the amounts of charges charged in the first to third liquid crystal capacitors C1 to C3 are different from each other, the arrangement of liquid crystal molecules may be different from each other. As a result, gray levels of the first sub-pixel SPX1, the second sub-pixel SPX2 and the third subpixel SPX3 may be different because the light passing through the first sub-pixel SPX1, the second sub-pixel SPX2 and the third sub-pixel SPX3 may be different. Eventually, the side visibility of the image provided through the pixel PXij may be improved.

However, the effects of the present inventive concept are not restricted to the one set forth herein. The above and other effects of the present inventive concept will become more apparent to one of daily skill in the art to which the present inventive concept pertains by referencing the claims.

What is claimed is:

1. A liquid crystal display comprising:
   a first transistor having a gate electrode connected to a scan line, one electrode connected to a data line, and the other electrode connected to a first liquid crystal capacitor;
   a second transistor having a gate electrode connected to the scan line, one electrode connected to the data line, and the other electrode connected to a second liquid crystal capacitor through a first node;
   a third transistor having a gate electrode connected to the scan line, one electrode connected to the data line, and the other electrode connected to a third liquid crystal capacitor through a second node;
   a first distribution transistor having a gate electrode connected to the scan line, one electrode connected to the first node, and the other electrode connected to a sustain line; and
   a second distribution transistor having a gate electrode connected to the scan line, one electrode connected to the second node, and the other electrode connected to the sustain line.

2. The liquid crystal display of claim 1, wherein the first and second distribution transistors have different channel sizes.

3. The liquid crystal display of claim 1, wherein a ratio of a voltage applied to the second liquid crystal capacitor to a voltage applied to the first liquid crystal capacitor is 0.65 to 0.70, and
   wherein a ratio of a voltage applied to the third liquid crystal capacitor to a voltage applied to the first liquid crystal capacitor is 0.76 to 0.82.

4. The liquid crystal display of claim 1, wherein the amounts of charges charged in the first to third liquid crystal capacitors are different from each other.

5. The liquid crystal display of claim 4, wherein the amount of charges charged in the first liquid crystal capacitor is greater than the amount of charges charged in the second liquid crystal capacitor, and the amount of charges charged in the second liquid crystal capacitor is greater than the amount of charges charged in the third liquid crystal capacitor.

6. The liquid crystal display of claim 1, wherein a sustain voltage provided from the sustain line and a data voltage have different voltage levels.

7. A liquid crystal display comprising:
   a data driver providing a data voltage to each of a plurality of data lines;
   a scan driver providing a scan signal to each of a plurality of scan lines; and
   a display panel including pixels, each pixel having first to third sub-pixels which receive the data voltage in response to the scan signal,
   wherein the second sub-pixel includes a first distribution transistor having one electrode connected to a sustain line, and the third sub-pixel includes a second distribution transistor having one electrode connected to the sustain line,
   wherein the first and second distribution transistors have different channel sizes,
   whererin the second sub-pixel further includes a second transistor having a gate electrode connected to the scan line, one electrode connected to the data line, and the other electrode connected to the other electrode of the first distribution transistor through a first node, and a second liquid crystal capacitor connected to the first node, and
   wherein the third sub-pixel further includes a third transistor having a gate electrode connected to the scan line, one electrode connected to the data line, and the other electrode connected to the other electrode of the second distribution transistor through a second node, and a third liquid crystal capacitor connected to the second node.

8. The liquid crystal display of claim 7, wherein the first sub-pixel includes a first transistor having a gate electrode connected to the scan line and one electrode connected to the data line, and a first liquid crystal capacitor connected to the other electrode of the first transistor,
   wherein the second sub-pixel further includes a second liquid crystal capacitor connected to the first node, and
   wherein the third sub-pixel further includes a third liquid crystal capacitor connected to the second node.

9. The liquid crystal display of claim 8, wherein the first transistor outputs the data voltage in response to the scan signal, and the output data voltage is applied to the first liquid crystal capacitor.

10. The liquid crystal display of claim 8, wherein the second transistor outputs the data voltage to the first node in response to the scan signal, and the first distribution transistor outputs a sustain voltage provided from the sustain line to the first node in response to the scan signal.

11. The liquid crystal display of claim 8, wherein the third transistor outputs the data voltage to the second node in response to the scan signal, and the second distribution transistor outputs a sustain voltage provided from the sustain line to the second node in response to the scan signal.

12. The liquid crystal display of claim 8, wherein the amount of charges charged in the first liquid crystal capacitor is greater than the amount of charges charged in the second liquid crystal capacitor, and the amount of charges charged in the second liquid crystal capacitor is greater than the amount of charges charged in the third liquid crystal capacitor.

13. The liquid crystal display of claim 8, wherein a ratio of a voltage applied to the second liquid crystal capacitor to a voltage applied to the first liquid crystal capacitor is 0.65 to 0.70, and
wherein a ratio of a voltage applied to the third liquid crystal capacitor to a voltage applied to the first liquid crystal capacitor is 0.76 to 0.82.

14. A liquid crystal display comprising:
a data driver providing a data voltage to each of a plurality of data lines;
a scan driver providing a scan signal to each of a plurality of scan lines; and
a display panel including pixels, each pixel having first to third sub-pixels which receive the data voltage in response to the scan signal,
wherein the second sub-pixel includes a first distribution transistor having one electrode connected to a first sustain line, and the third sub-pixel includes a second distribution transistor having one electrode connected to the second sustain line,
wherein the second sub-pixel further includes a second transistor having a gate electrode connected to the scan line, one electrode connected to the data line, and the other electrode connected to the other electrode of the first distribution transistor through a first node, and a second liquid crystal capacitor connected to the first node, and
wherein the third sub-pixel further includes a third transistor having a gate electrode connected to the scan line, one electrode connected to the data line, and the other electrode connected to the other electrode of the second distribution transistor through a second node, and a third liquid crystal capacitor connected to the second node.

15. The liquid crystal display of claim 14, wherein a first sustain voltage provided from the first sustain line and a second sustain voltage provided from the second sustain line have different voltage levels.

16. The liquid crystal display of claim 14, wherein the first sub-pixel includes a first transistor having a gate electrode connected to the scan line and one electrode connected to the data line, and a first liquid crystal capacitor connected to the other electrode of the first transistor.

17. The liquid crystal display of claim 16, wherein the first transistor outputs the data voltage in response to the scan signal, and the output data voltage is applied to the first liquid crystal capacitor.

18. The liquid crystal display of claim 16, wherein the second transistor outputs the data voltage to the first node in response to the scan signal, and the first distribution transistor outputs a first sustain voltage provided from the first sustain line to the first node in response to the scan signal, and
wherein the third transistor outputs the data voltage to the second node in response to the scan signal, and the second distribution transistor outputs a second sustain voltage provided from the second sustain line to the second node in response to the scan signal.

19. The liquid crystal display of claim 16, wherein the amount of charges charged in the first liquid crystal capacitor is greater than the amount of charges charged in the second liquid crystal capacitor, and the amount of charges charged in the second liquid crystal capacitor is greater than the amount of charges charged in the third liquid crystal capacitor.

20. The liquid crystal display of claim 16, wherein a ratio of a voltage applied to the second liquid crystal capacitor to a voltage applied to the first liquid crystal capacitor is 0.65 to 0.70, and wherein a ratio of a voltage applied to the third liquid crystal capacitor to a voltage applied to the first liquid crystal capacitor is 0.76 to 0.82.

\* \* \* \* \*